United States Patent
Sandhu

(10) Patent No.: US 9,792,982 B1
(45) Date of Patent: Oct. 17, 2017

(54) METHOD, SYSTEM AND DEVICE FOR READ SIGNAL GENERATION

(71) Applicant: ARM Ltd., Cambridge (GB)

(72) Inventor: Bal S. Sandhu, Fremont, CA (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/087,788

(22) Filed: Mar. 31, 2016

(51) Int. Cl.
| G11C 16/28 | (2006.01) |
| G11C 13/00 | (2006.01) |
| H01L 27/24 | (2006.01) |
| G11C 11/56 | (2006.01) |
| G11C 16/26 | (2006.01) |

(52) U.S. Cl.
CPC ............ *G11C 13/004* (2013.01); *H01L 27/24* (2013.01); *G11C 11/5642* (2013.01); *G11C 16/26* (2013.01); *G11C 16/28* (2013.01)

(58) Field of Classification Search
CPC ...... G11C 16/28; G11C 16/26; G11C 11/5642
USPC ...................................... 365/185.21
See application file for complete search history.

(56) References Cited

U.S. PATENT DOCUMENTS

| 7,298,640 | B2 | 11/2007 | Chen et al. |
| 7,639,523 | B2 | 12/2009 | Celinska et al. |
| 7,778,063 | B2 | 8/2010 | Brubaker et al. |
| 7,872,900 | B2 | 1/2011 | Paz de Araujo et al. |
| 9,514,814 | B1 | 12/2016 | Sandhu et al. |
| 9,558,819 | B1 | 1/2017 | Aitken et al. |
| 9,584,118 | B1 | 2/2017 | Dao et al. |
| 9,589,636 | B1 | 3/2017 | Bhavnagarwala et al. |
| 2002/0110021 | A1* | 8/2002 | Kai .................. G11C 16/28 365/185.21 |
| 2005/0045919 | A1 | 3/2005 | Kaeriyama et al. |
| 2008/0106925 | A1 | 5/2008 | Paz de Araujo et al. |
| 2008/0106926 | A1 | 5/2008 | Brubaker et al. |
| 2008/0107801 | A1 | 5/2008 | Celinska et al. |
| 2013/0200323 | A1 | 8/2013 | Pham et al. |
| 2013/0214232 | A1 | 8/2013 | Tendulkar et al. |
| 2013/0285699 | A1 | 10/2013 | McWilliams et al. |
| 2017/0033782 | A1 | 2/2017 | Shifren et al. |
| 2017/0045905 | A1 | 2/2017 | Sandhu et al. |
| 2017/0047116 | A1 | 2/2017 | Sandhu et al. |
| 2017/0047919 | A1 | 2/2017 | Sandhu et al. |
| 2017/0069378 | A1 | 3/2017 | Shifren et al. |

* cited by examiner

*Primary Examiner* — Jason Lappas
(74) *Attorney, Agent, or Firm* — Berkeley Law & Technology Group, LLP

(57) ABSTRACT

Disclosed are methods, systems and devices for generation of a read signal to be applied across a load for use in detecting a current impedance state of the load. In one implementation, a voltage and current of a generated read signal may be controlled so as to maintain a current impedance state of the load.

17 Claims, 9 Drawing Sheets

US 9,792,982 B1

METHOD, SYSTEM AND DEVICE FOR READ SIGNAL GENERATION

BACKGROUND

1. Field

Disclosed are techniques for utilizing memory devices.

2. Information

Non-volatile memories are a class of memory in which the memory cell or element does not lose its state after power supplied to the device is removed. The earliest computer memories, made with rings of ferrite that could be magnetized in two directions, were non-volatile, for example. As semiconductor technology evolved into higher levels of miniaturization, the ferrite devices were abandoned for the more commonly known volatile memories, such as DRAMs (Dynamic Random Access Memories) and SRAMs (Static-RAMs).

One type of non-volatile memory, electrically erasable programmable read-only memory (EEPROM) devices have large cell areas and may require a large voltage (e.g., from 12.0 to 21.0 volts) on a transistor gate to write or erase. Also, an erase or write time is typically of the order of tens of microseconds. One limiting factor with EEPROMs is the limited number of erase/write cycles to no more than slightly over 600,000—or of the order of $10^5$-$10^6$. The semiconductor industry has eliminated a need of a pass-gate switch transistor between EEPROMs and non-volatile transistors by sectorizing a memory array in such a way that "pages" (e.g., sub-arrays) may be erased at a time in EEPROMs called flash memory devices. In flash memory devices, an ability to keep random access (erase/write single bits) was sacrificed for speed and higher bit density.

More recently, FeRAMs (Ferroelectric RAMs) have provided low power, relatively high write/read speed, and endurance for read/write cycles exceeding 10 billion times. Similarly, magnetic memories (MRAMs) have provided high write/read speed and endurance, but with a high cost premium and higher power consumption. Neither of these technologies reaches the density of flash memory devices, for example. As such, flash remains a non-volatile memory of choice. Nevertheless, it is generally recognized that flash memory technology may not scale easily below 65 nanometers (nm); thus, new non-volatile memory devices capable of being scaled to smaller sizes are actively being sought.

Technologies considered for the replacement of flash memory devices have included memories based on certain materials that exhibit a resistance change associated with a change of phase of the material (determined, at least in part, by a long range ordering of atoms in the crystalline structure). In one type of variable resistance memory called a phase change memory (PCM/PCRAM) devices, a change in resistance occurs as the memory element is melted briefly and then cooled to either a conductive crystalline state or a non-conductive amorphous state. Typical materials vary and may include GeSbTe, where Sb and Te can be exchanged with other elements of the same or similar properties on the Periodic Table. However, these resistance-based memories have not proved to be commercially useful because their transition between the conductive and the insulating state depends on a physical structure phenomenon (e.g., melting at up to 600 degrees C.) and returning to a solid state that cannot be sufficiently controlled for a useful memory in many applications.

Another variable resistance memory category includes materials that respond to an initial high "forming" voltage and current to activate a variable resistance function. These materials may include, for example, $Pr_xCa_yMn_zO_\epsilon$, with x, y, z and $\epsilon$ of varying stoichiometry; transition metal oxides, such as CuO, CoO, $VO_x$, NiO, $TiO_2$, $Ta_2O_5$; and some perovskites, such as Cr; $SrTiO_3$. Several of these memory types exist and fall into the resistive RAMs (ReRAMs) or conductive bridge RAMS (CBRAM) classification, to distinguish them from the chalcogenide type memories. It is postulated that resistance switching in these RAMs is due, at least in part, to the formation of narrow conducting paths or filaments connecting the top and bottom conductive terminals by the electroforming process, though the presence of such conducting filaments are still a matter of controversy. Since operation of a ReRAM/CBRAM may be strongly temperature dependent, a resistive switching mechanism in a ReRAM/CBRAM may also be highly temperature dependent. Additionally, these systems may operate stochastically as the formation and movement of the filament is stochastic. Other types of ReRAM/CBRAM may also exhibit unstable qualities. Further, resistance switching in ReRAM/CBRAMs tends to fatigue over many memory cycles. That is, after a memory state is changed many times, a difference in resistance between a conducting state and an insulative state may change significantly. In a commercial memory device, such a change may take the memory out of specification and make it unusable.

Given an inherent difficulty in forming a thin film resistance switching material that is stable over time and temperature, a workable resistance switching memory remains a challenge. Furthermore, all resistance switching mechanisms developed up to now have been inherently unsuitable for memories, due to high currents, electroforming, no measurable memory read or write windows over a reasonable range of temperatures and voltages, and many other problems such as stochastic behavior. Thus, there remains a need in the art for a non-volatile memory that is deterministic has low power, high speed, high density and stability, and in particular, such a memory that is scalable to feature sizes well below 65 nanometers (nm).

DETAILED DESCRIPTION

Figure 1A:
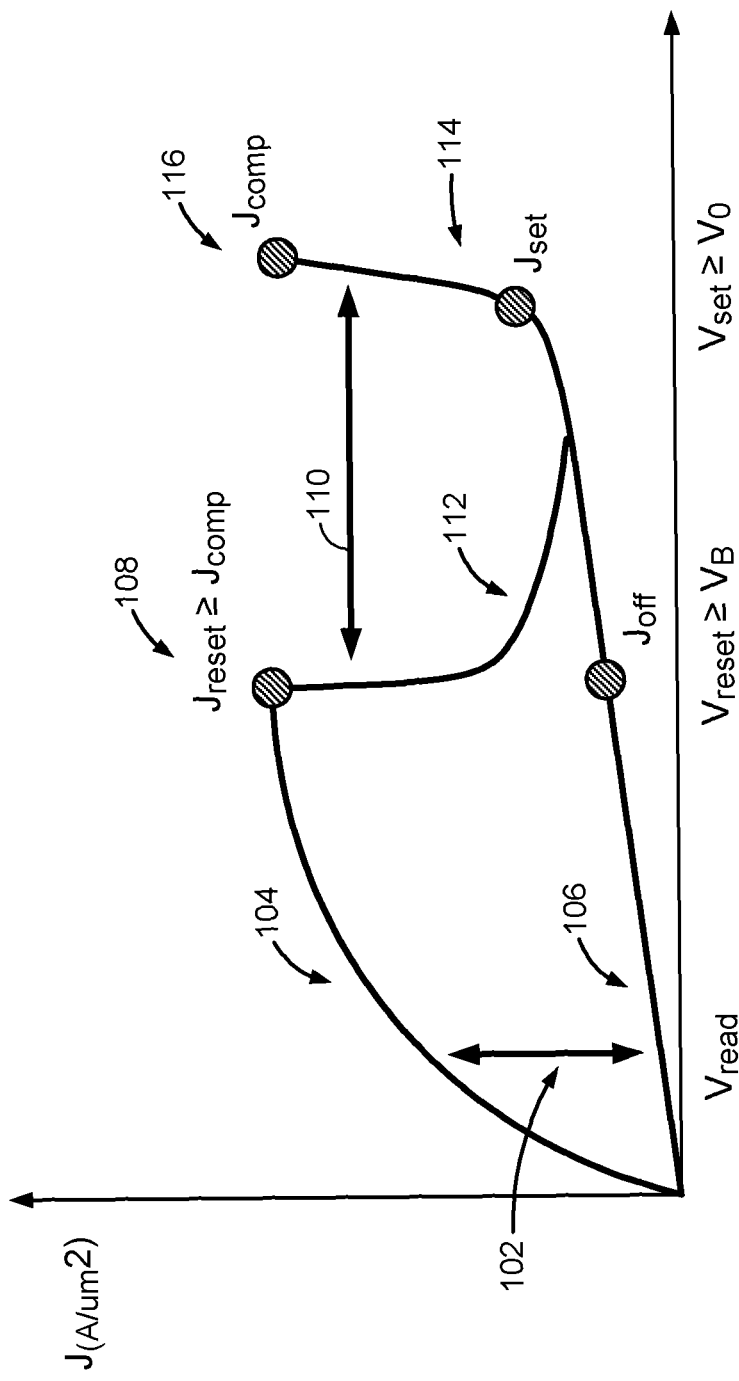
FIG. 1A shows a plot of current density versus voltage for a correlated electron switch (CES) device according to an embodiment.

Particular aspects of the present disclosure incorporate a Correlated Electron Material (CEM) to form a correlated electron switch (CES). In this context, a CES may exhibit an abrupt conductor/insulator transition arising from electron correlations rather than solid state structural phase changes (e.g., crystalline/amorphous in phase change memory (PCM) devices or filamentary formation and conduction in resistive RAM devices as discussed above). In one aspect, an abrupt conductor/insulator transition in a CES may be responsive to a quantum mechanical phenomenon, in contrast to melting/solidification or filament formation. Such a quantum mechanical transition between conductive and insulative states in a CEM memory device may be understood in any one of several aspects.

In one aspect, a quantum mechanical transition of a CES device between an insulative state and a conductive state may be understood in terms of a Mott transition. In a Mott transition, a material may switch from an insulative state to a conductive state if a Mott transition condition occurs. The criteria may be defined by the condition $(n_C)^{1/3} a=0.26)$, where $n_C$ is a concentration of electrons and "a" is a Bohr radius. If a critical carrier concentration is achieved such that the Mott criteria is met, a Mott transition may occur and state may change from a high resistance/capacitance (or high impedance state) to a low resistance/capacitance (or low impedance state).

In one aspect, a Mott transition may be controlled by a localization of electrons. As carriers are localized, a strong coulomb interaction between electrons splits the bands of the material creating an insulator. If electrons are no longer localized, a weak coulomb interaction may dominate band splitting, leaving behind a metal (conductive) band. This is sometimes explained as a "crowded elevator" phenomenon. While an elevator has only a few people in it, the people can move around easily, which is analogous to a conducting state. While the elevator reaches a certain concentration of people, on the other hand, passengers can no longer move, which is analogous to the insulative state. However, it should be understood that this classical explanation provided for illustrative purposes, like all classical explanations of quantum phenomenon, is only an incomplete analogy, and that claimed subject matter is not limited in this respect.

In particular implementations of aspects of this disclosure, a resistive switching integrated circuit memory may comprise: a resistive switching memory cell including a CES device; a write circuit for placing the resistive switching memory cell in a first impedance state or a second impedance state depending on signals provided to the memory cell, wherein an impedance of the CES device is higher in the second impedance state than in the first impedance state; and a read circuit for sensing the state of the memory cell and providing an electrical signal corresponding to the sensed state of the memory cell. In one aspect, an impedance of a CES device in the second memory cell state may be more than 100 times the impedance in the second memory cell state. In a particular implementation, a CES device may switch impedance states responsive to a Mott-transition in the majority of the volume of the CES device. In one aspect, a CES device may comprise a material selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

In a particular embodiment, a CES device may be formed as a "CEM random access memory (CeRAM)" device. In this context, a CeRAM device comprises a material that may transition between or among a plurality of predetermined detectable memory states based, at least in part, on a transition of at least a portion of the material between a conductive state and an insulative state utilizing the quantum mechanical Mott transition. In this context, a "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative memory states. As discussed in the particular example implementations below, material of a CES element sandwiched between conductive terminals may be placed in an insulative or high impedance memory state by application of a first programming signal across the terminals having a voltage $V_{reset}$ and current $I_{reset}$, or placed in a conductive or low impedance memory state by application of a second programming signal across the terminals having a voltage $V_{set}$ and current $I_{set}$. In this context, it should be understood that terms such as "conductive or low impedance" state and "insulative or high impedance" state are relative terms and not specific to any particular quantity or value for impedance or conductance. For example, while a memory device is in a first memory state referred to as an insulative or high impedance state the memory device in one aspect is less conductive (or more insulative) than while the memory device in a second state referred to as a conductive or low impedance state.

In a particular implementation, CeRAM memory cells may comprise a metal/CEM/metal (M/CEM/M) stack formed on a semiconductor. Such an M/CEM/M stack may be formed on a diode, for example. In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1A shows a plot of current density versus voltage across terminals (not shown) for a CES device according to an embodiment. Based, at least in part, on a voltage applied to terminals of the CES device (e.g., in a write operation), the CES device may be placed in a low impedance or conductive state, or a high impedance or insulative state. For example application of a voltage $V_{set}$ and current density $J_{set}$ may place the CES device in a low impedance or conductive state and application of a voltage $V_{reset}$ and a current density $J_{reset}$ may place the CES device in a high impedance or insulative state. Following placement of the CES in an insulative state or conductive state, the particular state of the CES device may be detected by application of a read signal having a voltage $V_{read}$ (e.g., in a read operation) and detection of a current or current density at terminals of the CeRAM device.

According to an embodiment, the CES device of FIG. 1A may include any TMO, such as, for example, perovskites, Mott insulators, charge exchange insulators, and Anderson disorder insulators. In particular implementations, a CES device may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES device may be prepared without electroforming. Other implementations may employ other transition metal compounds without deviating from claimed subject matter. For example, {M(chxn)$_2$Br}Br$_2$ where M may comprise Pt, Pd, or Ni, and chxn comprises 1R,2R-cyclohexanediamine, and other such metal complexes may be used without deviating from claimed subject matter.

In one aspect, the CES device of FIG. 1A may comprise materials that are TMO metal oxide variable resistance materials, though it should be understood that these are exemplary only, and are not intended to limit claimed subject matter. Particular implementations may employ other variable resistance materials as well. Nickel oxide, NiO, is disclosed as one particular TMO. NiO materials discussed herein may be doped with extrinsic ligands, which may stabilize variable resistance properties. In particular, NiO variable resistance materials disclosed herein may include a carbon containing ligand, which may be indicated by NiO(C$_x$). Here, one skilled in the art may determine a value of x for any specific carbon containing ligand and any specific combination of carbon containing ligand with NiO simply by balancing valences. In another particular example, NiO doped with extrinsic ligands may be expressed as NiO(L$_x$), where L$_x$ is a ligand element or compound and x indicates a number of units of the ligand for one unit of NiO. One skilled in the art may determine a value of x for any specific ligand and any specific combination of ligand with NiO or any other transition metal simply by balancing valences.

If sufficient bias is applied (e.g., exceeding a band-splitting potential) and the aforementioned Mott condition is met (injected electron holes=the electrons in a switching region), the CES device may rapidly switch from a conductive state to an insulator state via the Mott transition. This may occur at point 108 of the plot in FIG. 1A. At this point, electrons are no longer screened and become localized. This correlation may result in a strong electron-electron interaction potential which splits the bands to form an insulator. While the CES device is still in the insulative state, current may generated by transportation of electron holes. If enough bias is applied across terminals of the CES, electrons may be injected into a metal-insulator-metal (MIM) diode over the potential barrier of the MIM device. If enough electrons have been injected and enough potential is applied across terminals to place the CES device in a set state, an increase in electrons may screen electrons and remove a localization of electrons, which may collapse the band-splitting potential forming a metal.

According to an embodiment, current in a CES device may be controlled by an externally applied "compliance" condition determined based, at least in part, on the external current limited during a write operation to place the CES device in a low impedance or conductive state. This externally applied compliance current may also set a condition of a current density for a subsequent reset operation to place the CES device in a high impedance or insulative state. As shown in the particular implementation of FIG. 1A, a current density J$_{comp}$ applied during a write operation at point 116 to place the CES device in an low impedance or conductive state may determine a compliance condition for placing the CES device in a high impedance or insulative state in a subsequent write operation. As shown, the CES device may be subsequently placed in a high impedance or insulative state by application of a current density J$_{reset} \geq$ J$_{comp}$ at a voltage V$_{reset}$ at point 108, where J$_{comp}$ is externally applied.

The compliance therefore may set a number of electrons in a CES device which are to be "captured" by holes for the Mott transition. In other words, a current applied in a write operation to place a CES device in a low impedance or conductive state may determine a number of holes to be injected to the CES device for subsequently transitioning the CES device to a high impedance or insulative state.

As pointed out above, a reset condition may occur in response to a Mott transition at point 108. As pointed out above, such a Mott transition may occur at condition in a CES device in which a concentration of electrons n equals a concentration of electron holes p. This condition may be modeled according to expression (1) as follows:

$$\lambda_{TF} n^{\frac{1}{3}} = C \sim 0.26 \quad (1)$$
$$n = \left(\frac{C}{\lambda_{TF}}\right)^3$$

where:
$\lambda_{TF}$ is a Thomas Fermi screening length; and
C is a constant.

According to an embodiment, a current or current density in a region 104 of the plot shown in FIG. 1A may exist in response to injection of holes from a voltage signal applied across terminals of a CES device. Here, injection of holes may meet a Mott transition criterion for the conductive state to insulative state transition at current I$_{MI}$ as a critical voltage V$_{MI}$ is applied across terminals of CES device. This may be modeled according to expression (3) as follows:

$$I_{MI}(V_{MI}) = \frac{dQ(V_{MI})}{dt} \approx \frac{Q(V_{MI})}{t} \quad (3)$$
$$Q(V_{MI}) = qn(V_{MI})$$

Where Q(V$_{MI}$) is the charged injected (hole or electron) and is a function of an applied voltage.

Injection of electron holes to enable a Mott transition may occur between bands and in response to critical voltage V$_{MI}$ and critical current I$_{MI}$. By equating electron concentration n with a charge concentration to bring about a Mott transition by holes injected by I$_{MI}$ in expression (3) according to expression (1), a dependency of such a critical voltage V$_{MI}$ on Thomas Fermi screening length $\lambda_{TF}$ may be modeled according to expression (4) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (4)$$
$$J_{reset}(V_{MI}) = J_{MI}(V_{MI}) = \frac{I_{MI}(V_{MI})}{A_{CeRam}} = \frac{q}{A_{CeRam} t}\left(\frac{C}{\lambda_{TF}(V_{MI})}\right)^3$$

Where:
A$_{CeRam}$ is a cross-sectional area of a CES element; and
J$_{reset}$(V$_{MI}$) is a current density through the CES element to be applied to the CES element at a critical voltage V$_{MI}$ to place the CES element in a high impedance or insulative state.

According to an embodiment, a CES element may be placed in a conductive memory state (e.g., by transitioning from an insulative memory state) by injection of a sufficient number of electrons to satisfy a Mott transition criteria.

In transitioning a CES element to a conductive memory state, as enough electrons have been injected and the potential across terminal of the CES device overcomes a critical switching potential (e.g., $V_{set}$), injected electrons begin to screen and unlocalize double-occupied electrons to reverse a disproportion reaction and closing the bandgap. A current density $J_{set}(V_{MI})$ for transitioning the CES element to the conductive memory state at a critical voltage $V_{MI}$ enabling transition to the conductive memory state may be expressed according to expression (5) as follows:

$$I_{IM}(V_{IM}) = \frac{dQ(V_{IM})}{dt} \approx \frac{Q(V_{IM})}{t} \quad (5)$$

$$Q(V_{IM}) = qn(V_{IM})$$

$$I_{IM}(V_{IM}) = \frac{Q(V_{IM})}{t} = \frac{qn(V_{IM})}{t} = \frac{q}{t}\left(\frac{C}{a_B}\right)^3$$

$$J_{set}(V_{IM}) =$$

$$J_{injection}(V_{IM}) = J_{IM}(V_{IM}) = \frac{I_{IM}(V_{IM})}{A_{CeRam}} = \frac{q}{A_{CeRam}t}\left(\frac{C}{a_B}\right)^3 \text{ where:}$$

$a_B$ is a Bohr radius.

According to an embodiment, a "read window" 102 for detecting a memory state of a CES device in a read operation may be set out as a difference between a portion 106 the plot of FIG. 1A while the CES device is in an insulative state and a portion 104 of the plot FIG. 1A while the CES device is in a conductive state at a read voltage $V_{read}$. In a particular implementation, read window 102 may be used to determine a Thomas Fermi screening length $\lambda_{TF}$ of material making up the CES device. For example, at a voltage $V_{reset}$, current densities $J_{reset}$ and $J_{set}$ may be related to according to expression (6) as follows:

$$\lambda_{TF}(@V_{reset}) = a_B \left(\frac{J_{reset}}{J_{off}}\right)^{\frac{1}{3}} \quad (6)$$

In another embodiment, a "write window" 110 for placing a CES device in an insulative or conductive memory state in a write operation may be set out as a difference between $V_{reset}$ (at $J_{reset}$) and $V_{set}$ (at $J_{set}$). Establishing $|V_{set}|>|V_{reset}|$ enables a switch between conductive and insulative states. $V_{reset}$ may be approximately at a band splitting potential arising from correlation and $V_{set}$ may be approximately twice the band splitting potential. It should be understood, however that in other implementation in other implementations, $V_{set}$ may be determined to be at a different multiple of a band splitting potential. In particular implementations, a size of write window 110 may be determined, at least in part, by materials and doping of the CES device.

Figure 1B:
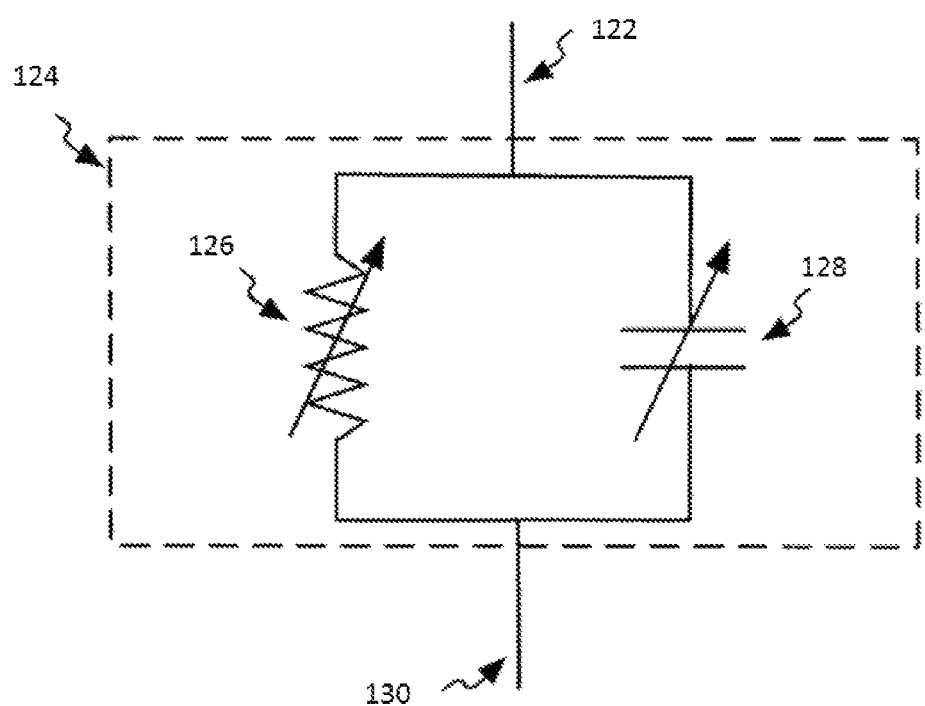
FIG. 1B is a schematic diagram of an equivalent circuit to a CES device according to an embodiment.

The transition from high resistance/capacitance to low resistance/capacitance in a CES device may be represented by a singular impedance of the CES device. FIG. 1B depicts a schematic diagram of an equivalent circuit of an example variable impeder device (such as a CES device), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Of course, although a variable resistor 126 and variable capacitor 128 are depicted in FIG. 1B as comprising discrete components, a variable impeder device, such as variable impeder device 124, may comprise a substantially homogenous CEM, wherein the CEM comprises characteristics of variable capacitance and variable resistance. Table 1 below depicts an example truth table for an example variable impeder device, such as variable impeder device 100.

TABLE 1

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})\sim 0$ | $Z_{low}(V_{applied})$ |

Figure 2:
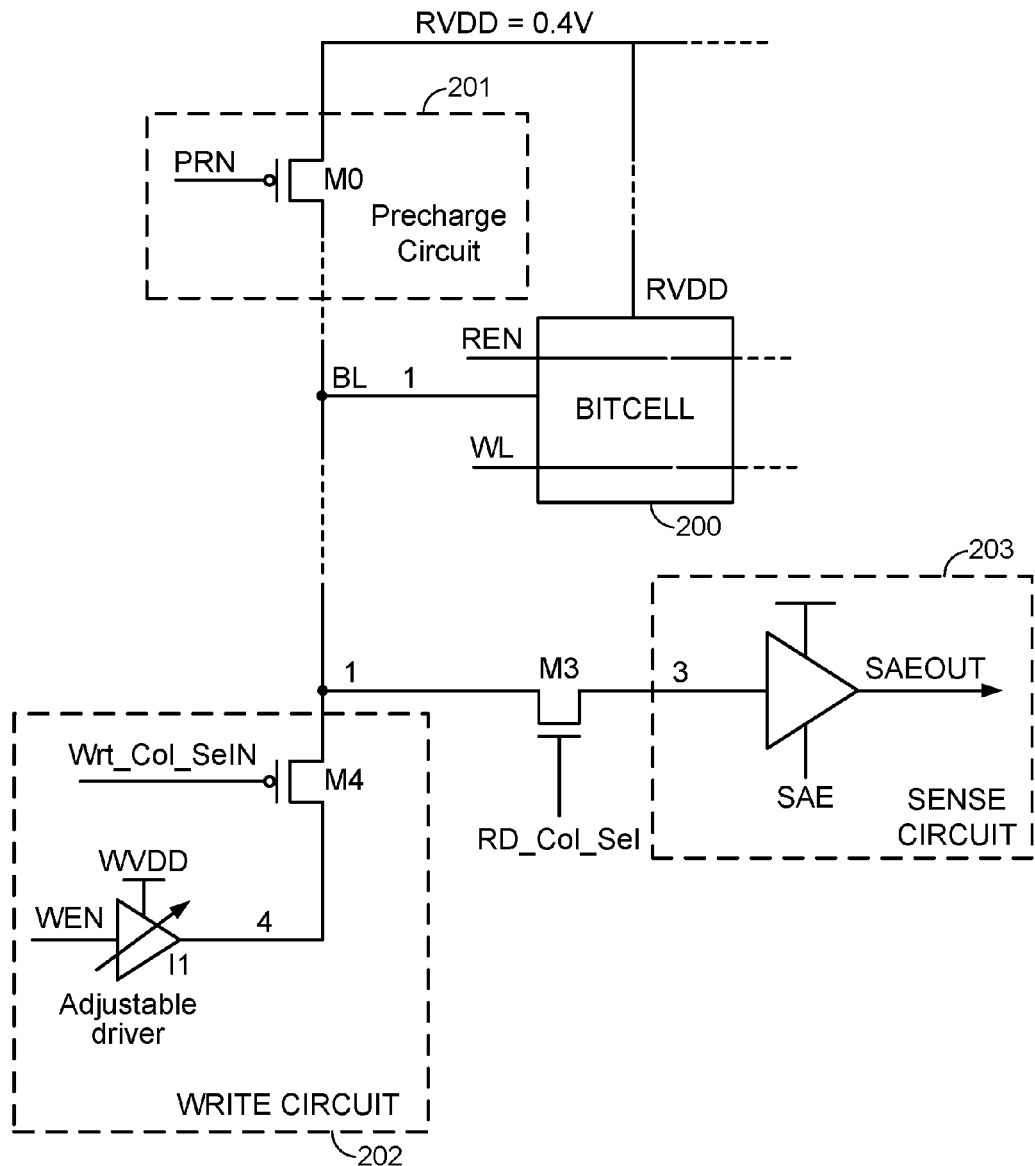
FIG. 2 is a schematic diagram of a memory circuit according to an embodiment.

FIG. 2 is a schematic diagram of a memory circuit according to an embodiment. A bitcell circuit 200 may comprise one or more memory elements (e.g., non-volatile memory elements) comprising a CES device. In this context, a "bitcell" or "bitcell circuit" as referred to herein comprises a circuit or portion of a circuit capable of representing a value, symbol or parameter as a state. For example, a bitcell may comprise one or more memory devices that capable of representing a value, symbol or parameter as a memory state of the memory device. In particular implementations, a bitcell may represent a value, symbol or parameter as a single bit or multiple bits.

According to an embodiment, bitcell circuit 200 may comprise memory elements having a behavior similar to that of the CES device discussed above in connection with FIG. 1A. For example, a memory element in bitcell 200 may be placed in a particular memory state (e.g., a conductive or low impedance memory state, or an insulative or high impedance memory state) by independently controlling voltage and current applied across terminals of the memory element in a "write operation." As discussed below in particular implementations, such a write operation may be executed by application of a signal which is controlled to provide a critical current and voltage across terminals of the memory device to place the memory device in a particular memory state. In another aspect, a memory state of a memory element in bitcell 200 may be detected or sensed in a "read operation" by precharging a bitline BL by closing transistor M0 in response to a drop in voltage of signal PRN to connect bitline BL with voltage RVDD=0.4V. Transistor M0 may subsequently open in response to an increase in voltage of signal PRN, followed by a closing of transistor M3 in response to an increase in voltage of signal RD_Col_Sel to connect bitline BL to sense circuit 203. In this context, a "bitline" comprises a conductor that is connectable to at least one terminal of a memory element during a write operation to transmit a signal altering a memory state of the memory element, or during a read operation to transmit a signal indicative of a current memory state of the memory element. Sense circuit 203 may detect a memory state of the memory element in bitcell 200 based on a magnitude of current or voltage from bitline BL through transistor M3 in a read operation. An output signal may have a voltage that is indicative of a current memory state of bitcell 200 (e.g., as a "1," "0" or other symbol). In one aspect of a read operation, to detect a current memory state of a memory element, a voltage of a read signal applied across terminals of the memory element in bitcell 200 may be controlled so as to not detectably alter the current memory state of the memory element.

Figure 3A:
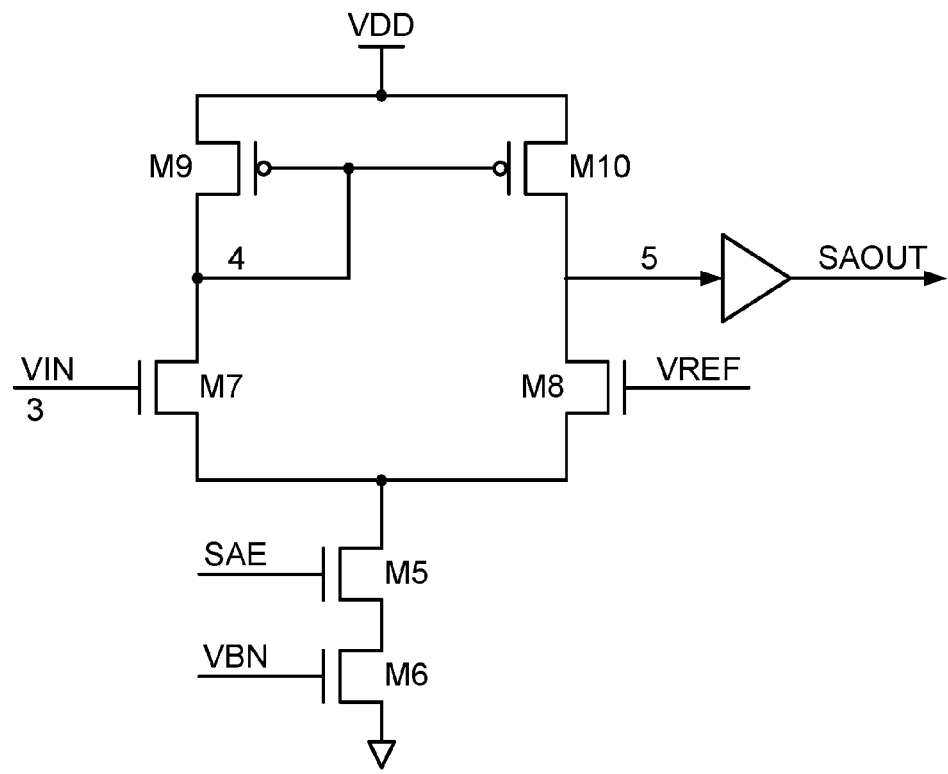
FIGS. 3A, 3B and 3C are schematic diagrams of alternative implementations of a sense circuit according to particular embodiments
Figure 3B:
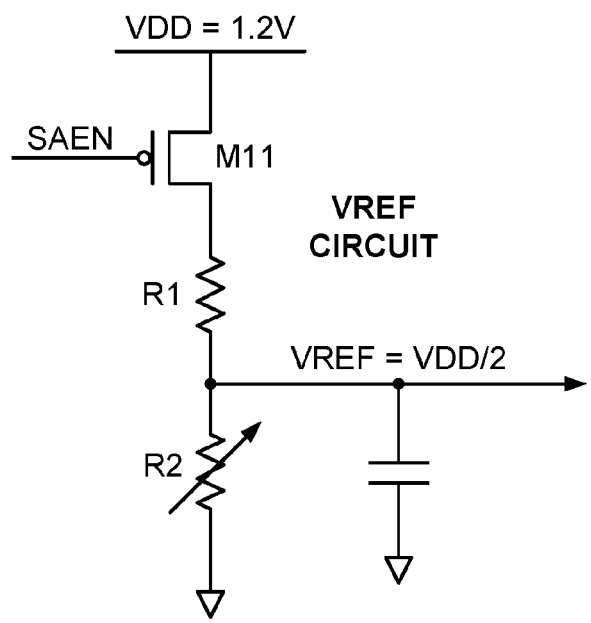
Figure 3C:
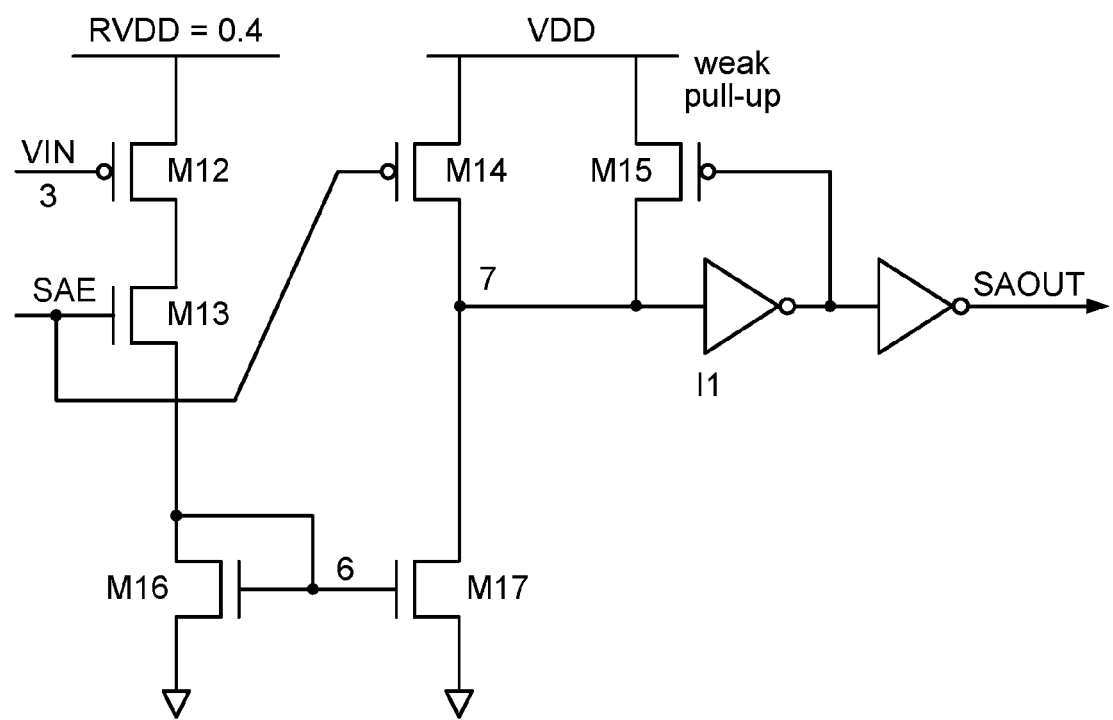

Particular example implementations of sense circuit 203 are shown in the schematic diagrams of FIGS. 3A through 3C. As shown in the particular example implementations, a sense circuit may comprise a single-ended sense amplifier circuit including a voltage mode amplifier as shown in FIG. 3A or a current mode amplifier as shown in FIG. 3C. The particular implementation of FIG. 3A comprises a differential voltage amplifier formed by field effect transistors (FETs) M7, M8, M9 and M10 to receive a signal from a bitline during a read operation and a reference voltage VREF. In a particular implementation, a signal maintained at a reference voltage VREF may be generated using a VREF circuit shown in the schematic diagram of FIG. 3B according to an embodiment. Here, reference voltage VREF may be set to VIN/2, where VIN is a voltage level on a bitline during a read operation. The VREF circuit of FIG. 3B may be activated during a read operation and generate a signal maintained at reference voltage VREF voltage using a resistor divider of two equal value hi-res Poly or Nwell resistors, R1 and R2, for example. It should be understood that this is merely an example of a circuit to generate a signal maintained at a reference voltage, and that claimed subject matter is not limited in this respect. For example, a differential voltage mode sense amplifier is for illustrative purposes only. A differential latch based voltage mode sense amplifier may also be used without deviating from claimed subject matter.

As pointed out above, another particular example implementation of a sense circuit is shown in the particular example implementation of a current mode sense amplifier shown in FIG. 3C. Here, a first stage comprises a current mirror which senses the voltage on the bitline, VIN at a gate terminal of transistor M12. A default state of the current sense mode amplifier of FIG. 3C is reading a value of "1" since the bitline is precharged to a particular voltage (e.g., VIN=0.4V) while the sense circuit of FIG. 3C is in a standby state with a voltage at SAE=0.0 V at a beginning of a read cycle. If a bitcell is written to a "0" level, the bitline may be pulled from 0.4V to 0.0V which appears as VIN while at the same signal SAE may be pulled to voltage VDD. This may turn on transistor M12 to mirror a current into a second stage forcing node 7 to be pulled to 0.0 V while pulling the sense circuit output SAOUT is to voltage VDD. At the end of a read cycle, signal SAE may return to 0.0V and the sense circuit of FIG. 3C may return to a standby state. It should be understood that the above described implementations of a sense circuit as illustrated in FIGS. 3A through 3C are merely example implementations, and that claimed subject matter is not limited by these particular example implementations.

In another aspect, bitcell 200 may be changed to or placed in a particular memory state (e.g., a high impedance or insulative state, or a low impedance or conductive state) in a write operation by applying a voltage signal Wrt_Col_SeIN to close transistor M4, connecting an adjustable driver circuit of write circuit 202 to bitline BL. In a particular implementation, write circuit 202 may drive a write supply voltage, WVDD, to a bitcell while a signal Wrt_Col_SeIN is maintained at 0.0 V. As pointed out above, a memory state of a CES device may be placed in a low impedance or conductive memory state, or a high impedance or insulative memory state by controlling a voltage and a current applied to terminals of the CES device. In a particular non-limiting example implementation, a signal generated by a write supply voltage WVDD may be driven to particular voltage levels to match the reset and set voltages $V_{reset}$ and $V_{set}$ for a CES device (e.g., 0.6V or 1.2V). In addition, write circuit 202 may comprise an adjustable strength driver to control a current density supplied to the CES device.

As pointed out above in FIG. 1A, a memory state of a CES device in bitcell 200 may be changed or determined based on a particular voltage and current applied to bitline BL. For example, providing a signal to bitline BL having a voltage $V_{reset}$ and a sufficient current $I_{reset}$ may place a CES device of bitcell 200 in an insulative or high impedance memory state. Likewise, providing a signal to bitline BL having a voltage $V_{set}$ and a sufficient current $I_{set}$ may place a CES device of bitcell 200 in a conductive or low impedance memory state. As may be observed from FIG. 1A, that while a magnitude of voltage $V_{set}$ is greater than a magnitude of voltage $V_{reset}$, a magnitude of current $I_{set}$ is lower than a magnitude of current $I_{reset}$.

Figure 4A:
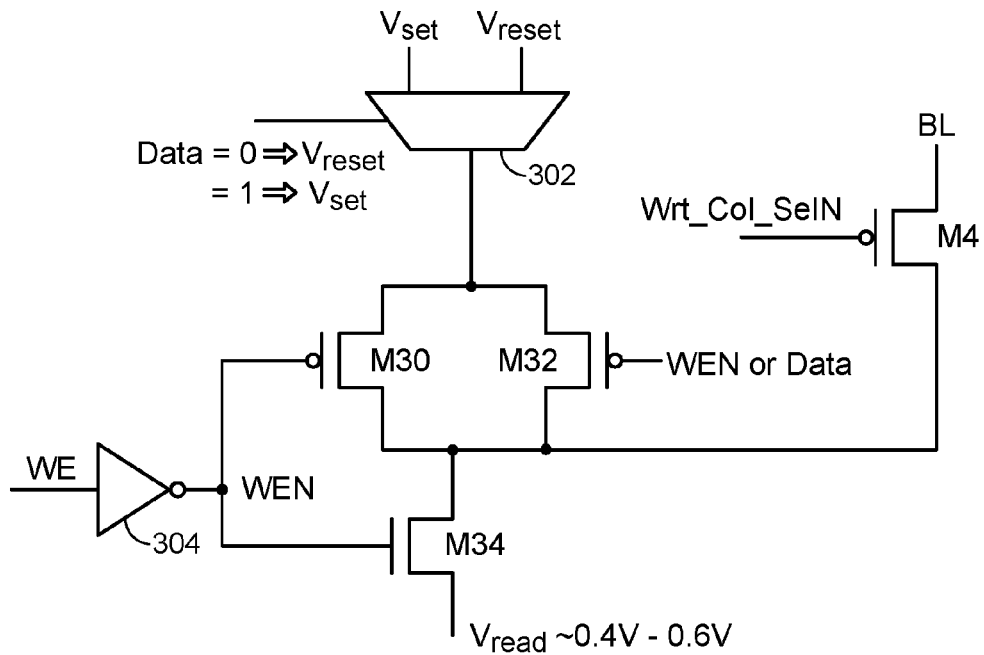
FIGS. 4A, 4B and 4C are schematic diagrams of alternative implementations of a write circuit according to particular embodiments.
Figure 4B:
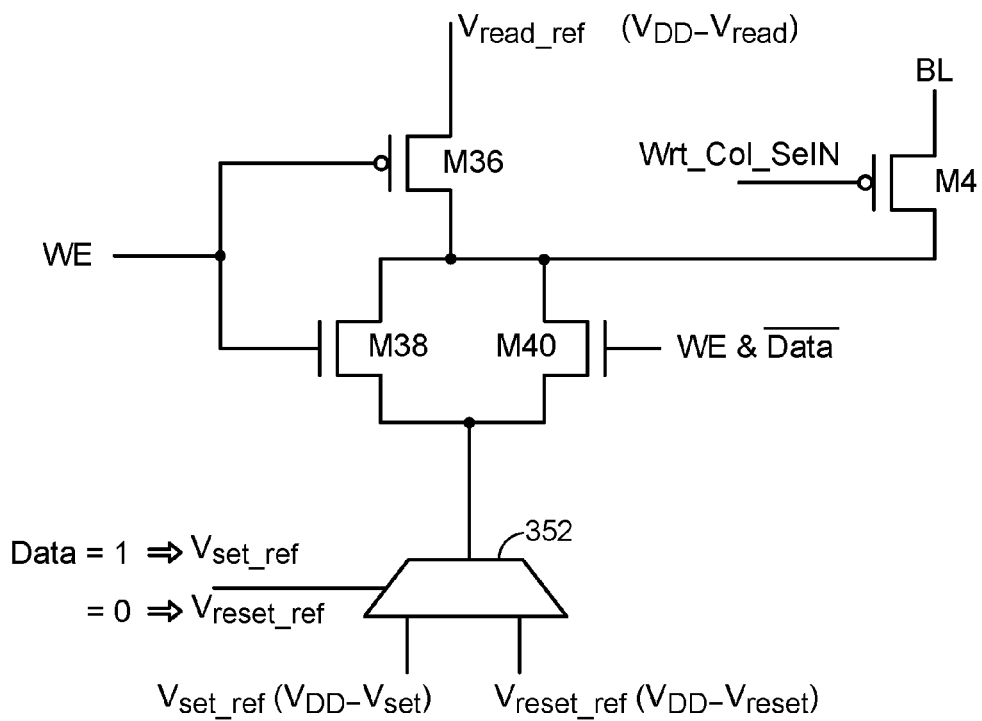

FIGS. 4A and 4B are schematic diagrams of write circuit 202 according to alternative implementations. In particular, a write operation is described as a particular process of placing a memory device such as a CES element in a particular memory state of a plurality of predetermined memory states by applying a "programming signal" to terminals of the memory device. Particular ones of the predetermined memory states may correspond to particular voltage levels to be applied to the memory device (e.g., $V_{set}$ and $V_{reset}$). Similarly, particular ones of the predetermined memory states may correspond to particular current levels to be applied to the memory device (e.g., $I_{set}$ and $I_{reset}$). Accordingly, in a particular embodiment, a programming signal to place a CES device in a particular memory state in a write operation may be controlled to have a particular voltage level and current level corresponding to the particular memory state. The specific example embodiments of FIGS. 4A and 4B are directed to providing a programming signal to a "single-ended" bitcell to place the particular bitcell in a particular memory state. It should be understood, however, that aspects of the specific example embodiments of FIGS. 4A and 4B may be applicable to generating one or more programming signals to place multiple CES elements in a bitcell to memory states based on a data signal, and that claimed subject matter is not limited to the specific example embodiments of FIGS. 4A and 4B. For example, a first write circuit according to FIG. 4A or 4B may be configured to apply a first programming signal placing a first CES element of a bitcell in a particular memory state and a second, replicated write circuit may be configured to apply a second programming placing a second CES element of the bitcell in a complementary memory state.

As described in a particular implementation below, a voltage signal having a voltage level for a programming signal to place a memory device in a predetermined memory state may be selected at a signal selection circuit based, at least in part, on a data signal. Conducting elements connected to the signal selection circuit may selectively connect the voltage signal to or disconnect the voltage signal from the memory device at a current level corresponding to the predetermined memory state based, at least in part, on the data signal. In this context, a "conducting element" comprises a circuit element capable of permitting current to pass between two nodes. In a particular implementation, a conducting element may vary a current permitted to pass between nodes based, at least in part, on a particular condition. The particular implementations described below employ FETs as conducting elements to permit current to pass between source and drain terminals based, at least in part, on a voltage applied to a gate terminal. It should be understood, however, that other types of devices such as, a bipolar transistor, diode, variable resistor, etc. may be used as a conducting element, and that claimed subject matter is not limited this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., a based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

Figure 4C:
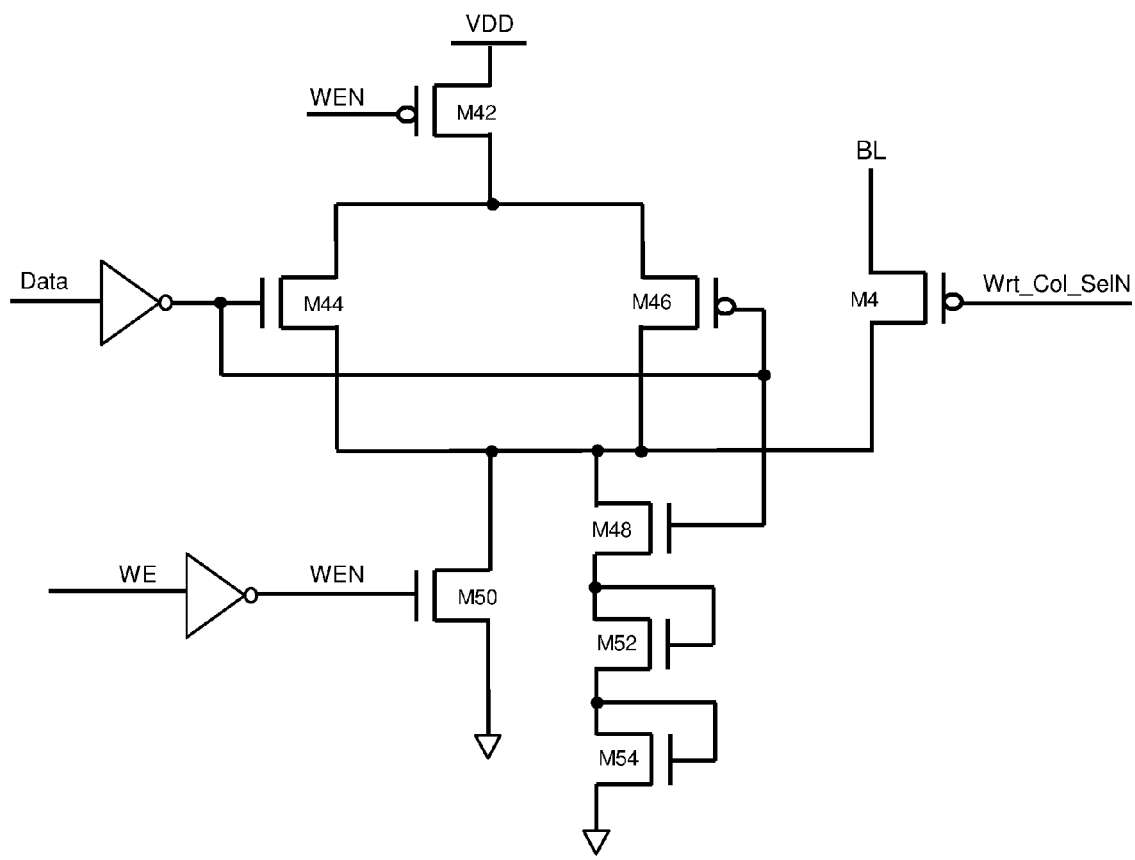

According to an embodiment, a signal may be provided to a bitline in an operation based, at least in part, on whether the operation is a read operation or a write operation. A signal WE may be received at an inverter 304 to provide a signal WEN to gates of FETs M34 and M30. If the particular operation is a read operation, transistor M34 may be closed in response to signal WE while FETs M30 and M32 may be opened in response to a voltage of signal WE to provide a voltage $V_{read}$ to the bitline. Furthermore, connecting voltage $V_{read}$ to FET M4 allows for less precise timing of closing M4 at the commencement of a write operation to apply a programming signal to a memory element. While FIGS. 4A, 4B and 4C show that FET M4 connects a single bitline BL to a write circuit, in particular implementations FET M4 may be among multiple conducting elements in a multiplexer to selectively connect an output signal of a write circuit to a bitline selected among multiple bitlines (e.g., where the write circuit is configured to provide a programming signal to any one of multiple bitlines leading to bitcells). In other embodiments in which one write circuit is provided per bitline, an output signal of a write circuit may be connected directly to a bitline without a connection from a conducting element responsive to a column select signal (e.g., without FET M4).

If the particular operation is a write operation, signal WEN may be at 0.0 V and FET M34 may be opened in response to a drop of a voltage on signal WEN to disconnect bitline BL from voltage $V_{read}$. In response to a lowered voltage on signal WEN to connect bitline BL to a programming signal maintained at a particular voltage and current to place a bitcell in either a conductive or low impedance memory state, or an insulative or high impedance memory state. FET M32 may be closed in a write operation to place the memory element in an insulative or high impedance memory state (e.g., for writing a "0") in a reset operation. For example, as shown in FIG. 4A, this may occur as signal WEN is low while Data="0" to close FET M32 as a voltage expressed by the condition "WEN or Data" is applied to a gate terminal of FET M32.

According to an embodiment, a multiplexer 302 may receive a voltage signal having a voltage $V_{set}$ and a voltage signal having a voltage $V_{reset}$ (e.g., critical voltages for placing a CES device in a conductive or low impedance memory state, or an insulative or high impedance memory state). According to an embodiment, voltage signals having voltages $V_{set}$ and $V_{reset}$ may be generated using any one of several circuits (not shown) including amplifiers and the like for generating a signal having a controlled voltage and/or current. Multiplexer 302 may select between providing a signal at voltage $V_{set}$ or voltage $V_{reset}$ to FETs M30 and M32 based, at least in part, on a data signal having a value of "1" or "0." In an embodiment, FET M30 may close in response to a lowered voltage on signal WEN to connect a selected voltage signal to bitline BL. Depending on whether the data signal has a value of "1" or "0," a magnitude of current provided to bitline BL may be affected. As illustrated above with reference to FIG. 1, a write operation to modify a memory state of a CES device to an insulative or high impedance memory state may be accomplished with a higher current density $J_{reset}$ than a current density $J_{set}$ to modify the memory state to a conductive or low impedance memory state. In a particular implementation, FET M32 and FET M30 may connect $V_{reset}$ to the bitline based on the value of the data signal received at multiplexer 302. As such, if a data signal received at multiplexer 302 in a write operation is a "0" for placing a CeRAM device in an insulative or high impedance memory state, both FETs M30 and M32 may be closed to permit sufficient current to flow to bitline BL at voltage $V_{reset}$ for placing the CeRAM device in an insulative or high impedance memory state. On the other hand, if a data signal received at multiplexer 302 in a write operation is a "1" for placing a CeRAM device in a conductive or low impedance memory state, FET M30 may be closed in response to a raised voltage of signal WE while FET M32 remains open to limit current flowing to bitline BL at voltage $V_{set}$ for placing the CeRAM device in a conductive or low impedance memory state.

In the alternative implementation of FIG. 4B, multiplexer 352 may select between providing $V_{set}$ or $V_{reset}$ to FETs M38 and M40 in a write operation based, at least in part, on a data signal having a value of "1" or "0." In a read operation, a voltage of signal WE may be lowered such that transistor M36 is closed to connect a voltage $V_{read-ref}$ to bitline BL, and such that FETs M38 and M40 are opened to disconnect multiplexer 352 from bitline BL. In a write operation, a voltage of signal WE may be raised such that FET M36 is opened to disconnect voltage $V_{read-ref}$ from bitline BL, and such that FET M38 is closed to connect a signal selected at multiplexer 352 to bitline BL through at least FET M38. If a data signal received at multiplexer 352 in a write operation is a "0" for placing a CES device in an insulative or high impedance memory state, both FETs M38 and M40 may be closed to permit sufficient current to flow to bitline BL at voltage $V_{reset}$ to place the CES device in an insulative or high impedance memory state. On the other hand, if a data signal received at multiplexer 352 in a write operation is a "1" for placing a CES device in a conductive or low impedance memory state, transistor M38 may be closed while transistor M40 remains open to limit current flowing to bitline BL at voltage $V_{set}$ to place the CES device in a conductive or low impedance memory state.

The particular example implementations of FIGS. 4A and 4B are capable of providing a read voltage signal to bitline BL during read operations. Here, signal Wrt_Col_SeIN may be lowered during read operations to close FET M4 and connect the read voltage signal to bitline BL (in addition to being lowered during write operations to connect a programming signal to bitline BL). In alternative implementations (as described below), a read signal may be generated locally at bitcell 200 to be provided to terminals of a memory element during read operations. In which case, signal Wrt- _Col_SeIN may be raised during read operations to open FET M4 signal and disconnect write circuit from bitline BL.

The particular example embodiments of FIGS. 4A and 4B above multiplexers 302 and 352 provide examples of a "signal selection circuit." In this context, a signal selection circuit provides circuit for selection of a signal having a particular voltage and current to be applied to a device. It should be understood, that multiplexers 302 and 352 are merely examples of a signal selection circuit, and that claimed subject matter is not limited in this respect. For example, a signal selection circuit may comprise select a signal generated from a source external to the signal selection circuit or generate a selected signal internally. In the particular write circuit of FIG. 4C, for example, a value of Data as "0" may close FET M44 and open FET M46 to provide a signal having a current $I_{reset}$. FETs M48, M52 and M54 may also close to provide a lower voltage. A value of Data as "1," on the other hand, may open FET M44 and close FET M46 to provide a signal having a current $I_{set}$. FETs M48, M52 and M54 may also open to provide a higher voltage.

Figure 5:
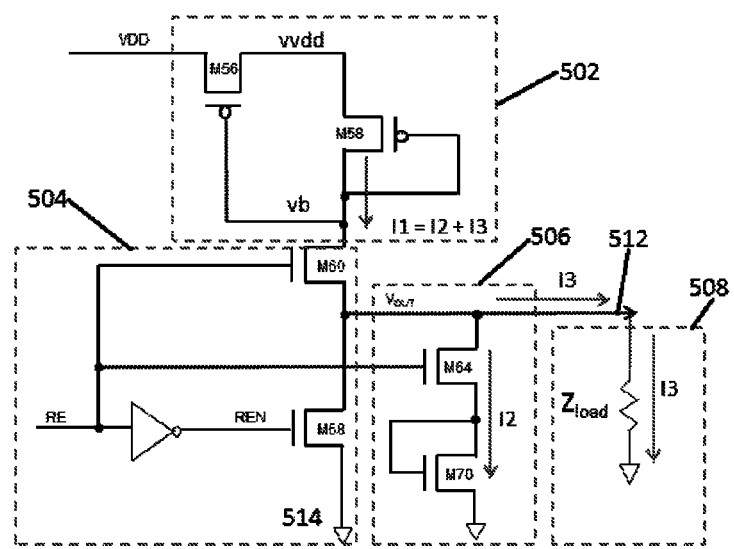
FIGS. 5 and 6 are schematic diagrams of circuits for applying a read signal for detection of a state of a load according to an embodiment.
Figure 6:
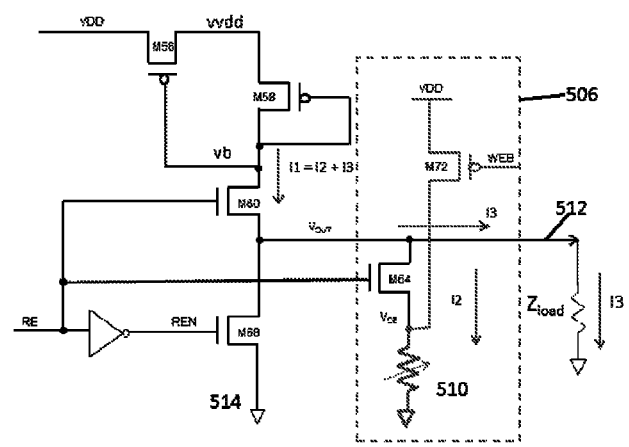

FIGS. 5 and 6 are schematic diagrams of alternative architectures for a generating a read signal to be applied to terminals of a CES device for detecting an impedance state according to a particular implementation. In an embodiment, a circuit may comprise an output terminal connected to the CES device to provide a signal across terminals of the CES device for detecting the impedance state. This signal may comprise a voltage $V_{read}$ and a current $I_{read}$ that is sufficient to enable detection of a current impedance state of the CES while not changing the impedance state of the CES (e.g., by initiating a set or reset operation).

As pointed out above, a "non-volatile memory" comprises an integrated circuit device in which a memory cell or element maintains its memory state (e.g., conductive or low impedance memory state, or an insulative or high impedance memory state) after power supplied to the device is removed. In this context, a "wordline" comprises a conductor for transmitting a signal to select a particular bitcell or group of bitcells to be accessed in a read operation or a write operation. In a particular example implementation, a voltage of a signal on a wordline may be raised or lowered to select or deselect a particular bitcell or group of bitcells to be connected to a corresponding bitline or group of bitlines during a read or write operation. It should be understood, however, that this is merely an example of a wordline and that claimed subject matter is not limited in this respect. Also, in this context, a "reference node" comprises a node in a circuit that is maintained at a particular voltage level or at a particular voltage difference from another node in the circuit. In other particular implementations, a reference node may be maintained at a particular voltage relative to that of a ground node.

As shown in FIG. 5, a first subcircuit 502 connected between a first source voltage VDD and an output terminal 512 at a voltage $V_{out}$ or reference voltage may control a source current I3 to be applied to an impedance circuit element $Z_{load}$. Impedance circuit element $Z_{load}$ may comprise an NVM device. In this context, $V_{out}$ may provide a reference voltage in that the particular voltage level at $V_{out}$ may be maintained relatively stable and/or constant even with some changes in an applied load. In one particular implementation impedance circuit element $Z_{load}$ may comprise a CES device capable of having a high impedance or insulative state, or a low impedance or conductive state as discussed above. Impedance circuit element $Z_{load}$ may also be configured as an NVM device in a bitcell (e.g., as a CeRAM device) to be accessible through a bitline and/or wordline (not shown) in write operations or read operations as discussed above. It should be understood, however, that impedance circuit element $Z_{load}$ may comprise different types of NVM devices or loads without deviating from claimed subject matter. A second subcircuit 506 connected to output terminal 512 may control the voltage $V_{out}$ of a read signal which is sufficient to enable detection of a current impedance state of a CES device while maintaining the current impedance state (e.g., without initiating a set or reset operation to change the current impedance state). For example, where impedance circuit element $Z_{load}$ comprises a CES device, the second subcircuit 506 may control $V_{out}$ to be less than a voltage sufficient to change an impedance state of the CES device from a low impedance state to a high impedance state (e.g., in a read operation).

According to an embodiment, a read operation to detect a current impedance state of impedance circuit element $Z_{load}$ may be performed following a write operation to place impedance circuit element $Z_{load}$ in a particular impedance state. In the particular embodiment in which impedance circuit element $Z_{load}$ comprises a CES device, as discussed above such a write operation may comprise a set operation to place the CES device in a low impedance or conductive state, or a reset operation to place the device in a high impedance or insulative state.

According to an embodiment, a read operation to detect a current state of $R_{load}$ may be initiated by subcircuit 504 in response to an assertion of signal RE. Here, asserting signal RE to a higher voltage at a gate of FET M60 may close M60, connecting subcircuit 502 to apply current I1 to output terminal 512. As pointed out above, subcircuit 502 is connected to a first source voltage VDD at a terminal of FET M56. Asserting signal RE to a higher voltage may lower a voltage of signal REN applied to a gate of FET M68 to open FET M68, disconnecting output terminal 512 from a node 514 maintained at a second source voltage (not shown). Asserting signal RE to a higher voltage may also close FETs M64 and M70 in subcircuit 506 such that a voltage at $V_{out}$ is determined by an impedance of diode connected FET M58 relative to an impedance of diode connected FET M70. For example, a voltage at $V_{out}$ may be based on (e.g., proportional to) a ratio of the impedance of diode connected FET M58 to the impedance of diode connected FET M70. Here, a voltage at $V_{out}$ may be controlled by appropriately sizing FET M58 relative to FET M70 in manufacturing.

According to an embodiment, in a read operation a terminal of impedance circuit element $Z_{load}$ may be connected to a charged bitline (not shown). A circuit (such as sense circuit 203 in FIG. 2) receiving the bitline connected to the terminal of impedance circuit element $Z_{load}$ may then detect an impedance state of impedance circuit element $Z_{load}$.

In a read operation (e.g., with FET M68 open and FET M60 closed), a read signal having a particular current I3 and read voltage may be applied across terminals of impedance circuit element $Z_{load}$. Current I1 generated by subcircuit 502 may be divided into component currents I2 and I3. Current I2 flows through FETs M64 and M70 while current I3 is applied across load $R_{load}$ in the read signal. A magnitude of current I1 may be determined based, at least in part, on a sizing of PFET M56 and M58. Subcircuit 502 generates an output voltage vb to a terminal of FET M60. Output voltage vb may also be applied to a gate of PFET M56 may impart a negative feedback to limit current I1. For example, as voltage vb increases, PFET M56 may reduce current I1. Here, limiting current I1 with negative feedback of subcircuit 502 may limit current I3 to not exceed a critical current that may change an impedance state of load $R_{load}$. In the particular implementation in which load $R_{load}$ comprises a CES device, for example, subcircuit 502 may limit I3 in a read operation to less than a critical current $I_{reset}$ to inhibit or prevent the CES device from transitioning from a low impedance or conductive state to a high impedance or insulative state (e.g., in a reset operation).

While the particular embodiment of FIGS. 5 and 6 show FET M58 as being configured as a PFET, in other particular implementations FET M58 may be alternatively formed as an NFET.

As pointed out above, second subcircuit 506 connected the output terminal may control the voltage $V_{out}$ to be sufficient to enable detection of a current impedance state of $R_{load}$ in a read operation while maintaining the current impedance state (e.g., without initiating a set or reset operation to change the current impedance state). Voltage $V_{out}$ at the output terminal may comprise a voltage drop across FETs M64 an M70, and be determined based, at least in part, a sizing of FETs M58 and M70. In one particular example implementation in which $R_{load}$ comprises a CES device, FET M70 may be sized to limit a maximum voltage for $V_{out}$ to be less than 0.55 V (e.g., $<V_{set}$) in a read operation to prevent a change of a state of the CES from a low impedance or conductive state to a high impedance or insulative state (e.g., in a set operation).

In the alternative implementation of FIG. 6, FET M70 of subcircuit 506 may be replaced with a CES device 510. Here, CES device 510 may be placed in a low impedance or conductive state by applying a programming signal in response-lowering a voltage of signal WEN to close PFET M72. Also, it may be observed that a voltage at terminal $V_{out}$ may be determined, at least in part, by an impedance of diode connected FET M58 relative to an impedance of CES device 510. For example, a voltage at $V_{out}$ may be based on (e.g., proportional to) a ratio of the impedance of diode connected FET M58 and to the impedance of CES device 510. Here, since a voltage at $V_{out}$ may be controlled by appropriately sizing FET M58 relative to CES device 510 in manufacturing.

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. A circuit comprising:
an impedance circuit element connected to an output terminal;
a first subcircuit connectable between a first source voltage and the output terminal to limit a source current applied to the output terminal; and
a second subcircuit connected to the output terminal to limit a voltage applied to the output terminal,
wherein a load current and voltage at the output terminal applied to the impedance circuit element are sufficient to maintain the voltage applied to the output terminal, said voltage at the output terminal being a reference voltage, wherein the second subcircuit further comprises a correlated electron switch (CES) device connected between the output terminal and a second source voltage configured in a low impedance or conductive state.

2. The circuit of claim 1, further comprising a third subcircuit to connect the output terminal to the first subcircuit in a read operation and disconnect the output terminal from a second source voltage in the read operation.

3. The circuit of claim 1, wherein a first portion of the source current is applied to the second subcircuit and a second portion of the source current comprises the load current.

4. The circuit of claim 1, wherein the first subcircuit comprises a negative feedback connection to affect the source current responsive to a voltage at the output terminal.

5. The circuit of claim 4, wherein the first subcircuit further comprises a first field effect transistor (FET) to control the source current responsive to an output voltage of the first subcircuit applied to a gate of the first FET.

6. The circuit of claim 5, wherein the first subcircuit further comprises a second FET to further control the source current responsive to the output voltage of the first subcircuit applied to a gate of the second FET, the second FET being diode connected.

7. The circuit of claim 6, wherein the second FET comprises a PFET.

8. A circuit comprising:
an impedance circuit element connected to an output terminal;
a first subcircuit connectable between a first source voltage and the output terminal to limit a source current applied to the output terminal; and
a second subcircuit connected to the output terminal to limit a voltage applied to the output terminal,
wherein a load current and voltage at the output terminal applied to the impedance circuit element are sufficient to maintain the voltage applied to the output terminal, said voltage at the output terminal being a reference voltage, wherein the first subcircuit comprises a first diode connected field effect transistor (FET), wherein the voltage at the output terminal is based, at least in part, on an impedance of the first diode connected FET, and wherein the second subcircuit further comprises a correlated electron switch (CES), and wherein the voltage applied to the output terminal is determined based, at least in part, on the impedance of the first diode connected FET and an impedance of the CES.

9. The circuit of claim 8, wherein the second subcircuit further comprises a second diode connected FET, and wherein the voltage applied to the output terminal is determined based, at least in part, on the impedance of the first diode connected FET and an impedance of the second diode connected FET.

10. A circuit comprising:
an impedance circuit element connected to an output terminal;
a first subcircuit connectable between a first source voltage and the output terminal to limit a source current applied to the output terminal; and
a second subcircuit connected to the output terminal to limit a voltage applied to the output terminal,
wherein a load current and voltage at the output terminal applied to the impedance circuit element are sufficient to maintain the voltage applied to the output terminal, said voltage at the output terminal being a reference voltage, wherein the voltage at the output terminal is applied to a terminal of the impedance circuit element, said impedance circuit element being capable of having an impedance state, wherein a load current and voltage at the output terminal applied across terminals of the impedance circuit element are sufficient to enable detection of the impedance state of the impedance circuit element while maintaining the impedance state, and wherein the second subcircuit is configured to limit the voltage at the output terminal to inhibit a change in the impedance state from a low impedance or conductive state to a high impedance or insulative state.

11. The circuit of claim 10, wherein the first subcircuit is configured to limit the source current applied to the output terminal so as to inhibit a change of the impedance state of the impedance circuit element from a low impedance or conductive state to a high impedance or insulative state in a read operation.

12. The circuit of claim 10, wherein the impedance circuit element comprises a correlated electron switch (CES) device, wherein the circuit further comprises a bitline connected to the CES device, and wherein the impedance state is detectable based, at least in part, on a current on the bitline during a read operation.

13. The circuit of claim 10, wherein the CES device comprises a correlated electron random access memory (CeRAM) element.

14. A method comprising:
limiting a load current across terminals of an impedance circuit element connected to an output terminal, the impedance circuit element being capable of having an impedance state, the load current being determined based, at least in part, on a source current generated by a first subcircuit;
limiting a voltage of a signal applied across the terminals of the impedance circuit element, the voltage of the signal being determined based, at least in part, on a second subcircuit; and
applying a programming signal across the terminals of the impedance circuit element to place the impedance circuit element in a high impedance or insulative state prior to application of a read signal in a read operation, wherein the load current and the voltage of the signal applied across the terminals of impedance circuit element are sufficient to enable detection of the impedance state of the impedance circuit element while maintaining the impedance state, and wherein the voltage of the read signal is limited so as to inhibit a change of the impedance state of the impedance circuit element from the high impedance or insulative state to a low impedance or conductive state in the read operation.

15. A method comprising:
limiting a load current across terminals of an impedance circuit element connected to an output terminal, the impedance circuit element being capable of having an impedance state, the load current being determined based, at least in part, on a source current generated by a first subcircuit;
limiting a voltage of the signal applied across the terminals of the impedance circuit element, the voltage of the signal being determined based, at least in part, on a second subcircuit; and
applying a programming signal across the terminals of the impedance circuit element to place the impedance circuit element in a low impedance or conductive state prior to application of a read signal in a read operation,
wherein the load current and the voltage of the signal applied across the terminals of impedance circuit element are sufficient to enable detection of the impedance state of the impedance circuit element while maintaining the impedance state, and
wherein the load current of the read signal is controlled so as to inhibit a change of the impedance state of the impedance circuit element from the low impedance or conductive state to a high impedance or insulative state in the read operation.

16. A method comprising:
limiting a load current across terminals of an impedance circuit element connected to an output terminal, the impedance circuit element being capable of having an impedance state, the load current being determined based, at least in part, on a source current generated by a first subcircuit; and
limiting a voltage of the signal applied across the terminals of the impedance circuit element, the voltage of the signal being determined based, at least in part, on a second subcircuit,
wherein the load current and the voltage of the signal applied across the terminals of impedance circuit element are sufficient to enable detection of the impedance state of the impedance circuit element while maintaining the impedance state, wherein impedance circuit element comprises a correlated electron switch (CES) device, further comprising detecting the impedance state of the CES device based, at least in part, on a current on a bitline connected to the CES device during a read operation.

17. The method of claim 16, wherein the CES device comprises a correlated electron random access memory (CeRAM) element.

* * * * *